United States Patent
Lownes (12) 
(10) Patent No.: US 6,369,861 B1
(45) Date of Patent: *Apr. 9, 2002

(54) PROGRAM SELECTION SYSTEM FOR A DIGITAL TELEVISION RECEIVER

(75) Inventor: George Lownes, Morton, PA (US)

(73) Assignee: Matsushita Electric Industrial Co., Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/829,101

(22) Filed: Mar. 31, 1997

(51) Int. Cl.[7] .................................. H04N 5/50
(52) U.S. Cl. .............. 348/731; 348/732; 348/385.1; 348/386.1; 348/553; 348/569
(58) Field of Search ............... 348/385–387, 348/553, 563, 569, 570, 731, 732, 906, 385.1, 386.1; H04N 5/50

(56) References Cited

U.S. PATENT DOCUMENTS

| | | | | |
|---|---|---|---|---|
| 4,979,047 A | * | 12/1990 | Wine | 348/569 |
| 5,461,427 A | * | 10/1995 | Duffield et al. | 348/555 |
| 5,559,808 A | * | 9/1996 | Kostreski et al. | 348/385 |
| 5,600,378 A | * | 2/1997 | Wasilewski | 348/468 |
| 5,677,708 A | * | 10/1997 | Matthew, III et al. | 348/906 |
| 5,805,230 A | * | 9/1998 | Staron | 348/460 |
| 5,822,123 A | * | 10/1998 | Davis et al. | 348/564 |
| 5,822,324 A | * | 10/1998 | Kostresti et al. | 370/487 |
| 5,844,620 A | * | 12/1998 | Coleman et al. | 348/906 |
| 5,847,771 A | * | 12/1998 | Cloutier et al. | 348/564 |

FOREIGN PATENT DOCUMENTS

| | | |
|---|---|---|
| EP | 0735776 A2 | 10/1996 |
| EP | 0751680 A2 | 1/1997 |
| WO | WO 96/37999 | 11/1996 |

OTHER PUBLICATIONS

International Search Report, Jul. 1, 1998.
"Program/Episode/Version Identification" ATSC Standard, Document A57, Aug. 30, 1996.

* cited by examiner

Primary Examiner—Michael H. Lee
Assistant Examiner—Linus H. Lo
(74) Attorney, Agent, or Firm—Ratner & Prestia (57) ABSTRACT

A program selection system for a consumer digital television receiver includes a numeric keypad and scrolling keys for selecting a channel through which a multi-program bit-stream is received. The numeric keypad and the scrolling keys may also be used to select an individual program from the multi-program bit-stream. In one embodiment of the invention, the numeric keypad is used first to select a channel and then to select a program within the channel. According to another embodiment of the invention, the numeric keypad is used to select the channel and another key is used to step through the programs that are contained in the multi-program stream that is carried by the channel. In a third embodiment, scrolling keys are used to select the next channel or the next program within the channel depending on whether the currently selected program is the last program in the bit-stream that is carried by the channel.

9 Claims, 5 Drawing Sheets

PROGRAM SELECTION SYSTEM FOR A DIGITAL TELEVISION RECEIVER

FIELD OF THE INVENTION

The present invention relates generally to digital television receivers and in particular to a method for selecting programs in television receivers that operate according to the digital television standard.

BACKGROUND OF THE INVENTION

Current analog television systems transmit one program per channel. Selection from among the channels being broadcast at any given time is made by adjusting the tuner to tune to the frequency of the desired channel.

Some digital television systems exist which transmit multiple programs via a satellite link. These systems include an electronic program guide which maps each program number into a particular transponder signal, a particular channel being transmitted by the transponder and a particular program in the channel. Thus, the electronic program guide is required to tune to a program being carried by one of these digital satellite systems. Thus an electronic program guide must be generated at the head-end and decoded by the receiver in order to tune to a specific program.

The *Digital Television Standard* as described in publication DOC.A/53 entitled "ATSC Digital Television Standard" published by Advanced Television Systems Committee, contemplates sending multiple programs in a single terrestrial broadcast channel or cable channel. Thus, each of several broadcasters who transmit signals in a given area may send a signal that contains a single high-definition program or multiple programs which may be either high-definition or standard definition programs. When each broadcaster sends multiple programs over its channel, the standard does not describe any preferred method by which these programs may be selected. The Digital Television Standard is a subset of the MPEG-2 standard defined by the Moving Picture Experts Group (MPEG) which is described in a publication entitled "Generic Coding of Moving Pictures and Associated Audio, Recommendation H.626", ISO/IEC 13818-2, IS, Nov. 1994 available from the International Standards Organization.

SUMMARY OF THE INVENTION

The present invention is embodied in a digital television receiver having a program selection apparatus. The program selection apparatus includes means by which a frequency corresponding to a television channel may be selected and second means by which individual programs within the television channel may be selected.

DETAILED DESCRIPTION

Figure 1:
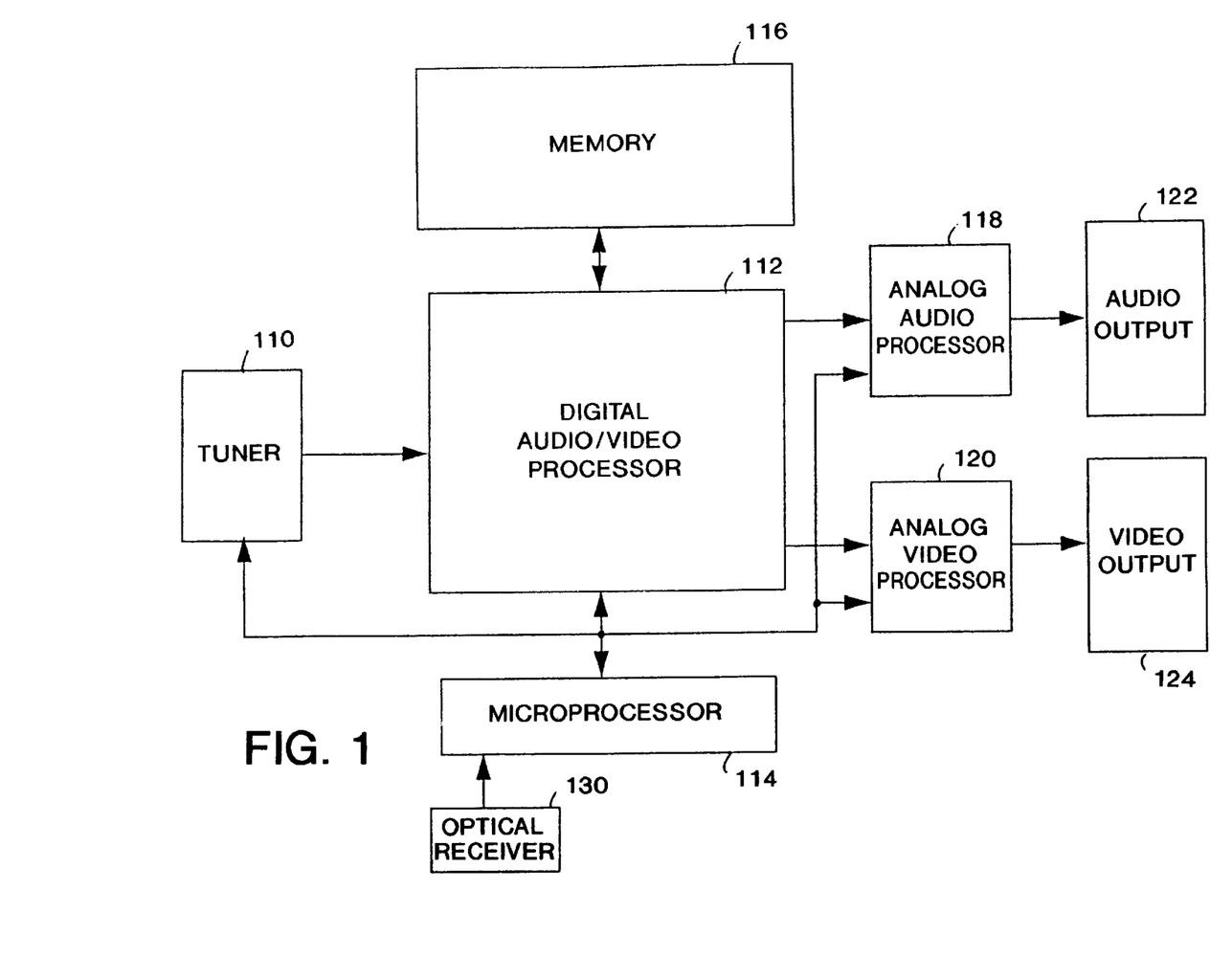
FIG. 1 is a block diagram of a television receiver which includes an embodiment of the present invention.

FIG. 1 is a block diagram of a digital television receiver that is suitable for use with the subject invention. In FIG. 1, a radio frequency (RF) signal which includes digital television signal components is received at tuner 110. In the exemplary embodiment of the invention, this signal has a bandwidth of 6 MHz and includes one or more digital television programs. Each program conforms to the above-referenced ATSC standard and includes at least a video component and an audio component. If the signal contains only one program then the program may include a high-definition television (HDTV) signal, (e.g. a Main Profile, High Level (MP@HL) signal as defined in the MPEG-2 standard) if it contains five programs then each program is may be an HDTV program or a standard definition television (SDTV) signal (e.g. a Main Profile, Main Level (MP@ML) signal as defined in the MPEG-2 standard).

The tuner 110 demodulates the RF signal and provides a digital signal to a digital audio/video signal processor 12. The audio/video signal processor is controlled by the microprocessor 114 to separate at least one program from the digital signal and store the signal as an elementary bit-stream or as program elementary stream (PES) packets in the memory 116. The digital audio/video processor 112 decodes the audio portion of the program and converts it to an analog signal. This signal is provided to an analog audio processor 118 which may, for example, amplify the analog audio signal and implement viewer controls such as volume, bass, treble and balance. The processed analog audio signal is provided to an audio output port 122. A sound system (not shown) may be coupled to the audio output port 122 to reproduce the audio portion of the selected television program.

The digital audio/video processor 112 also decodes the encoded video component of the program stored in the memory 116 and provides an analog video signal to an analog video processor 120. The processor 120 may, for example, adjust properties of the analog video signal such as color saturation, hue, brightness and contrast to provide a processed video signal to a video output port 124. A television monitor (not shown) may be coupled to the video output port 124 to reproduce the video portion of the selected television program.

Figure 3:
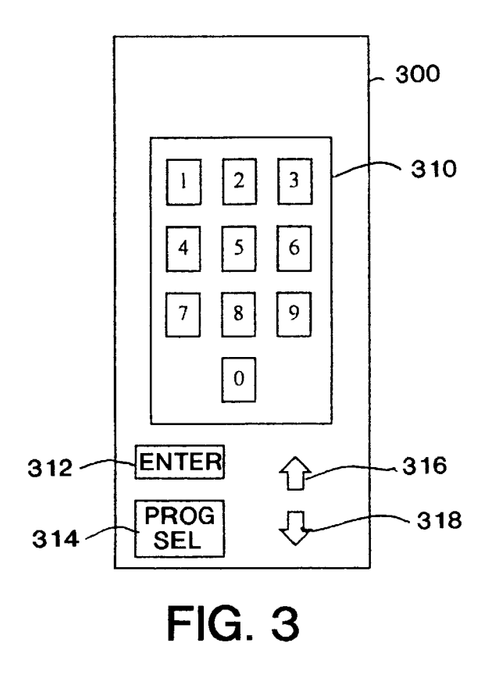
FIG. 3 is a top-plan view of a remote control unit suitable for use with the digital television receiver shown in FIG. 1.

The microprocessor receives commands to control the operation of the tuner 110, digital audio/video processor 112, analog audio processor 118 and analog video processor 120 from an optical receiver 130. In the exemplary embodiment of the invention, this optical receiver is responsive to optical signals generated by a remote control unit. An exemplary remote control unit is shown in FIG. 3 which is described in greater detail below.

Figure 2:
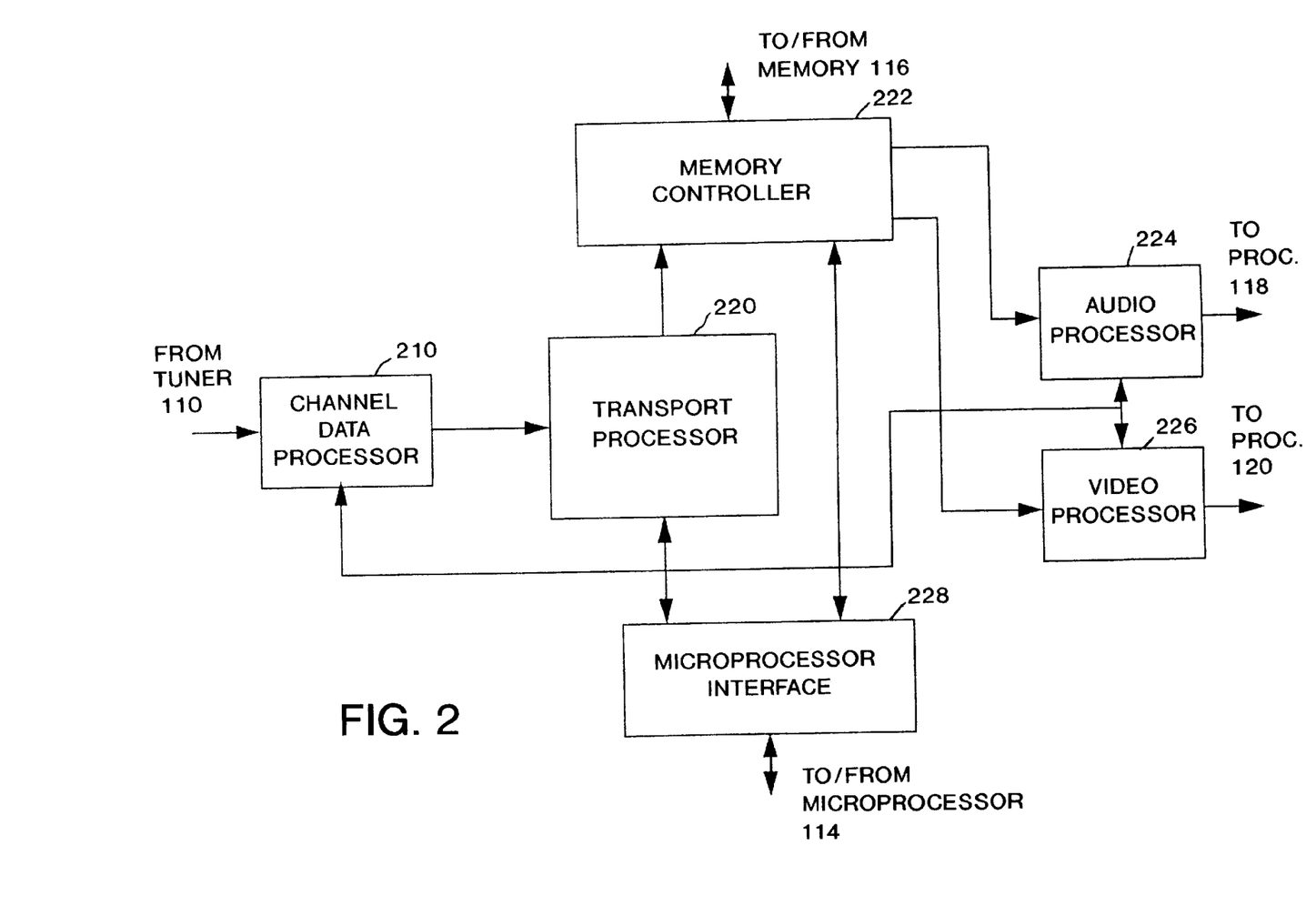
FIG. 2 is a block diagram of the digital audio/video processor shown in FIG. 1.

FIG. 2 is a block diagram of a digital audio/video processor suitable for use as the processor 112 shown in FIG. 1. In FIG. 2, the demodulated digital television signal is received from the tuner 110 by a channel data processor 210. This signal includes a sequence of transport packets and defines a transport bit-stream. Each transport packet occupies 188 bytes and contains either data that is defined for the entire transport bit-stream, such as the Program Association Table (PAT); data that is used for a group of components that define a single program, such as the Program Map Table (PMT); or data that is used for the for only one component (e.g. audio, video or data) of a single program.

The processor 210 monitors the transport bit-stream to extract the PAT transport packets and provides these packets to the microprocessor 114 through a microprocessor interface 228. These packets are identified by having a packet identifier (PID) value of zero. The PAT contains a table of programs being carried in the transport bit-stream and the PIDs of their corresponding PMTs. Microprocessor 114 decodes these packets to determine PID values for packets containing the PMTs for each program contained in the transport bit-stream. The microprocessor 114, using the interface 228, sends these PID values to the channel data processor 210, causing the processor 210 to separate the PMT packets from the transport bit-stream and provide these packets to the microprocessor 114. The microprocessor 114 recovers the PMTs from the packets passed by the channel data processor 210. Thus, the microprocessor always has a current set of program map tables for the transport bit-stream that is being received.

Using the PMTs, the microprocessor 114 controls the transport processor 220 to recover, from the transport bit-stream, the program components for a program that has been selected by the viewer. The program components are contained in transport packets, each component having a separate PID, as described below with reference to Table 3. The transport processor, responsive to PID values provided via the microprocessor interface 228, captures each packet having a PID corresponding to the selected program, extracts the payload portion from the transport packets and stores the payload portions for each component into a respective first-in-first-out (FIFO) data structure in the memory 116. Data transfers from the transport processor to the memory 116 are made using direct memory access (DMA) techniques through the memory controller 222.

In accordance with the above-referenced ATSC and MPEG-2 standards, the transport packets are relatively small (188 byte) fixed-length packets which encapsulate variable-length program elementary stream (PES) packets. The payload portions of the PES packets, in turn, are elementary bit-streams that defined the encoded components. The exemplary transport processor 220 can be controlled by the microprocessor 114 to decode the transport packets into PES packets or to further decode the PES packets into their respective elementary bit-streams. Either the PES packets or the bit-streams may be stored in the FIFO data structures.

As the packet contents for the video and audio components of the program are placed into the FIFO data structures, the microprocessor 116 causes the memory controller 222 to provide the data from the FIFO data structures to the audio decoding processor 224 and video decoding processor 226. If the processors 224 and 226 can process data in PES packet format, the transport decoder 220 stores the payloads from the transport packets into the FIFO data structures. If the decoding processor 224 or 226 expects to receive bit-stream data, then the transport processor further decodes the respective PES packets to provide an elementary bit-stream to the processor.

The audio processor 224 and video processor 226 decode the compressed digital data in the respective bit-streams to provide analog audio and video signals, respectively, to the analog audio processor 118 and analog video processor 120.

As described above, in this exemplary embodiment of the invention, the viewer uses a remote control device to select a program to watch on a television monitor that is coupled to the decoder shown in FIG. 1. Selection signals are sent from the remote control unit to the microprocessor 114 which controls the transport processor 220, causing it to extract a different program stream from the transport bit-stream and causing the memory interface 222 to send the respective extracted audio and video program streams to the audio and video decoders. Because the same bit stream is used, the different program stream is selected without adjusting the tuner. To understand how the various program streams are extracted, it is helpful to understand the structure of the PAT and PMT. These are presented below in Table 1 and Table 2.

The program association table (PAT) is composed of one or more sections, each section has the syntax defined in Table 1.

TABLE 1

Program Association Table

| Syntax | Number of Bits |
|---|---|
| Table ID | 8 |
| section_syntax_indicator | 1 |
| '0' | 1 |
| reserved | 2 |
| section_length | 12 |
| transport_stream_id | 16 |
| reserved | 2 |
| version_number | 5 |
| current_next_indicator | 1 |
| section_number | 8 |
| last_section_number | 8 |
| for (i = 0; i < N; i++) { | |
|    program_number | 16 |
|    reserved | 3 |
|    if (program_number == 0 { | |
|       network_PID | 13 |
|    } | |
|    else { | |
|       program_map_PID | 13 |
|    } | |
| } | |
| CRC_32 | 32 |

In the exemplary embodiment of the invention, the PAT is assumed to have only one section, section zero.

The PAT is used by the microprocessor 114 to identify the packets that contain the PMTs for the respective programs that are carried in the transport bit-stream. That is to say, each program in the transport bit-stream has one entry in the PAT that defines the program number for the program and the PID of the packets that contain the PMT for the program. As shown in Table 1, there are N program_number values and N program_map_PID values in the PAT, one for each of N programs that are contained in the transport bit-stream. Table 2 defines the structure of the program map table.

TABLE 2

Program Map Table

| Syntax | Number of Bits |
|---|---|
| Table ID | 8 |
| section_syntax_indicator | 1 |
| '0' | 1 |
| reserved | 2 |
| section_length | 12 |
| program_number | 16 |
| reserved | 2 |
| version_number | 5 |
| current_next_indicator | 1 |
| section_number | 8 |
| last_section_number | 8 |
| reserved | 3 |
| PCR_PID | 13 |
| reserved | 4 |
| program_info_length | 12 |
| for (i = 0; i < M; i++) { | |

TABLE 2-continued

Program Map Table

| Syntax | Number of Bits |
|---|---|
|       descriptor() | |
|   } | |
|   for (i = 0; i < M; i++) { | |
|       stream_type | 8 |
|       reserved | 3 |
|       elementary_PID | 13 |
|       reserved | 4 |
|       ES_info_length | 12 |
|       for (i = 0; i < N; i++) { | |
|           descriptor() | |
|   } | |
| CRC_32 | 32 |

As defined by Table 2, there may be as many as M elementary_PID values defined for each PMT. Each elementary PID value identifies packets that contain a separate program elementary stream corresponding to a respective component of the program. The stream_type field of the PMT entry indicates whether the elementary stream is audio, video or data and also identifies the encoding method used to produce the bit-stream. Thus, by knowing the stream type and the elementary PID for each program component in the PMT, the microprocessor 114 can instruct the channel data processor 210 and transport processor 220 to direct the components for the selected program to FIFO data structures in the memory 116 and, from these data streams, to the audio and video processors 224 and 226.

Television programs which have been encoded in accordance with the program identification paradigms defined by the ATSC may be separated from the transport bit-stream using only the PMT PID extracted from the PAT. The PMT PID, for programs which follow the paradigm, may be used to derive PIDs for at least the audio and video components for the program. The program clock reference (PCR) values for the program are presumed to be contained in the video bit-stream. According to this paradigm, the PMT PID (also known as the base PID) is a 13 bit value that includes two parts, a program number which is stored in eight high-order bits (11:4) and may have values between 1 and 255, and a low-order four-bit value (3:0) which changes for various components of the program. The program number portion of the PMT PID is the same as the program number field of the PMT entry from the PAT, shown in Table 1. An exemplary set of components for a television program that corresponds to the paradigm are shown in Table 3.

TABLE 3

| Name | PID Definition | Description |
|---|---|---|
| PMT_PID | base_PID + 0 × 0000 | PID for the bit-stream containing the program_map_table for the program. |
| Video_PID | base_PID + 0 × 0001 | PID for the bit-stream containing the video for the program. |
| Audio_PID | base_PID + 0 × 0004 | PID for the bit-stream containing the primary audio for the program. |
| Data_PID | base_PID + 0 × 000A | PID for the bit-stream containing the data for the program. |

A program that adheres to the paradigm has a logic-zero in the most significant bit (12) of the 13 bit PMT_PID. Programs not adhering to the paradigm have a logic-one in this bit.

Shortly after synchronizing to the transport bit-stream, the microprocessor 114 constructs a program correspondence table which associates each program number identified in the PAT with the PIDs of the respective components of the program as identified in the PMTs or by the paradigm.

The digital audio/video processor 112, shown in FIGS. 1 and 2 is able to process multiple program streams concurrently, directing the respective program components to separate FIFO structures. This may be advantageous, as described below, when a viewer wants to cycle through the various programs that are carried on a single channel. To aid in the rapid switching among programs that are carried in a single channel, all programs carried by the transport bit-stream may be decoded and assigned to respective sets of FIFO structures. When a request to change to a different program in the channel is received, the microprocessor 114 (shown in FIG. 1) directs the memory controller 222 (shown in FIG. 2) to provide the respective bit-streams from the newly selected program to the audio and video processors 224 and 226 in place of the bit-streams from the previous program.

FIG. 3 is a top-plan view of a remote control device suitable for use with the present invention. The exemplary remote control device 300 includes a numeric keypad 310, an enter key 312, a program selection key 314 and up and down scrolling keys 316 and 318. As described below, the keys on this device may be used to select programs and channels in a television receiver or set-top converter which receives multi-program digitally coded television signals conforming to the above-referenced ATSC standard.

Figure 4:
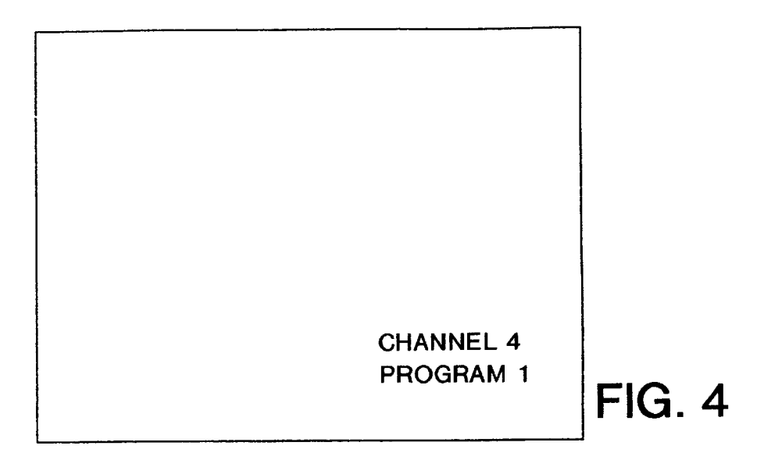
FIGS. 4 and 5 are exemplary channel number and program number displays which may be generated by the digital receiver shown in FIG. 1.
Figure 5:
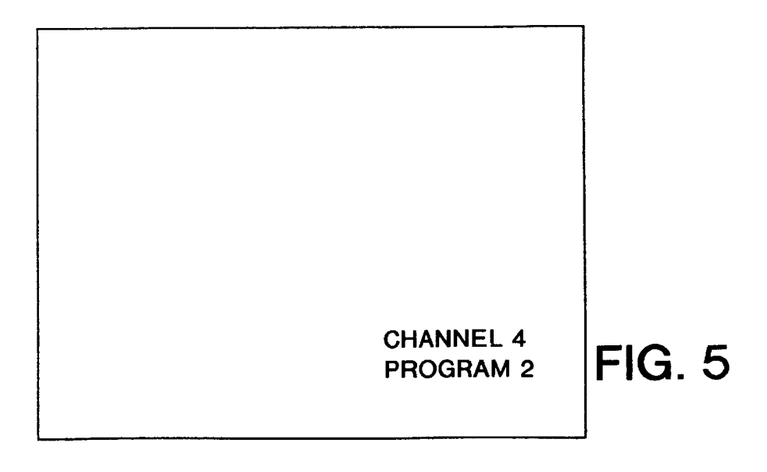

FIGS. 4 and 5 show exemplary on-screen displays that may be produced by a television receiver or set-top converter suitable for use with the subject invention. These displays include a channel portion and a program portion. The exemplary display shown in FIG. 4 is displayed when the microprocessor 114 causes the tuner to switch to channel 4. In the absence of a specific program selection, the system extracts the first program, in this case program 1, from the transport bit-stream. If the viewer later selects program 2 by one of the methods described below, the on-screen display shown in FIG. 5 appears, keeping the channel number the same but changing the program number to "2".

A television receiver or set-top converter operating according to the present invention uses one or more of the three methods described below to switch among programs. According to the first method, described below with reference to FIG. 6, the viewer uses the numeric keypad 310 first to select a channel and then to select a program within that channel. Using the second method, which is described below with reference to FIG. 7, the viewer uses the numeric keypad 310 or the scrolling buttons 316 and 318 to select a channel and then using the program selection button 314 to step through the programs in a particular channel. The third method uses the scrolling buttons 316 and 318 both to step through the channels and to step through the programs in each channel. These methods are not mutually exclusive and it is contemplated that, with slight modifications, all three methods may be implemented in a single program selection device.

All of the flow-charts described below show processing performed by the microprocessor 114 in response to program selection received from the program selection device 300 via the optical receiver 130. The button-presses that initiate this processing are interpreted by the microprocessor 114 as interrupts. When a signal is received from the optical receiver 130, it causes an interrupt in the microprocessor 114, initiating a process which collects and parses a sequence of signals. When the microprocessor has parsed a sequence that conforms to a command, for example, "1, 2, enter," it invokes an appropriate process shown in FIGS. 6, 7 or 8. In the example, the process shown in FIG. 6 would be invoked, passing the number 12.

Figure 6:
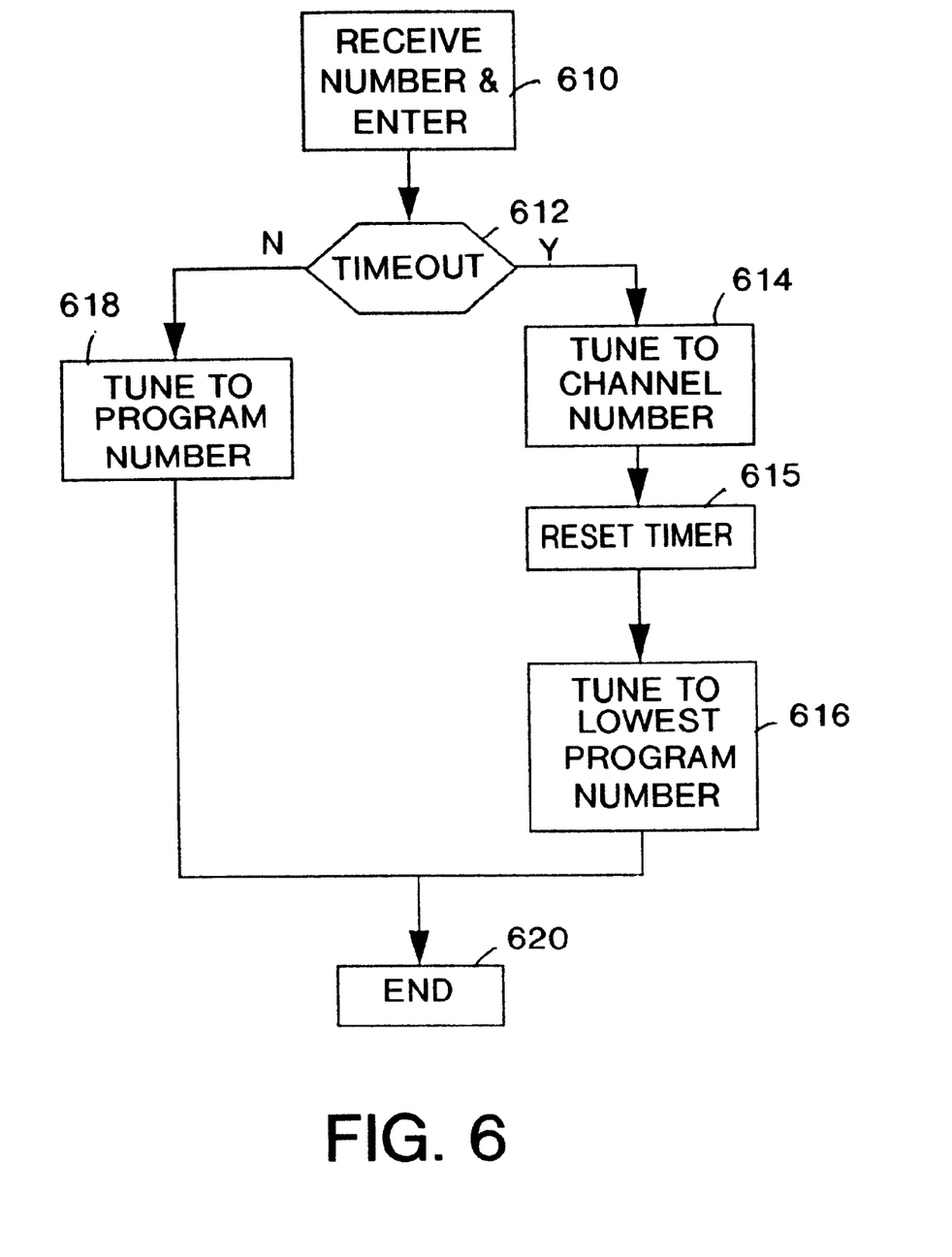
FIGS. 6, 7, and 8 are flow chart diagrams which are useful for describing the operation of the program selection mechanism of the television receiver shown in FIG. 1.

FIG. 6 is a flow-chart diagram which describes a first program selection method. Using this method, a viewer specifies a channel number using the keypad 310, presses the enter key 312, specifies a program number within the channel using the keypad 310 and presses the enter key again. As described above, if a viewer only selects a channel without selecting a specific program, the selection circuit according to the present invention will automatically select the program in the channel which has the lowest program number. To distinguish between a channel selection, program selection pair and two sequential channel selections, the exemplary system includes a timer.

In FIG. 6, a number is received at step 610. Next, at step 612, the microprocessor 114 checks the timer to determine if it has timed-out. If so, the number is presumed to be a channel number and step 614 is executed by which the microprocessor 112 instructs the tuner to change to the specified channel number and resets the timer at step 615. At step 616, the microprocessor 114 builds the program correspondence table from the PAT and, optionally, the PMT data in the bit-stream that is received through the channel, and instructs the channel data processor 210 to separate and decode packets corresponding to the lowest. program number in the program correspondence table.

If, at step 612, the timer has not timed-out, then the specified number is presumed to be a program number within the channel and, at step 618, the microprocessor 114 retrieves the PIDs associated with the specified program number from the program correspondence table and instructs the channel data processor 210, transport processor 220 and memory controller 222 to provide the bit-streams having these PIDs to the audio processor 224 and video processor 226. If there is no program in the program correspondence table corresponding to the specified program number, the microprocessor 114 controls the on-screen display to display a blank screen with the channel number and "Invalid Program Number ##" where "##" corresponds to the program number received at step 610. After step 616 or step 615, step 620 is executed which returns control to the process that was running when the microprocessor 114 was interrupted.

Figure 7:
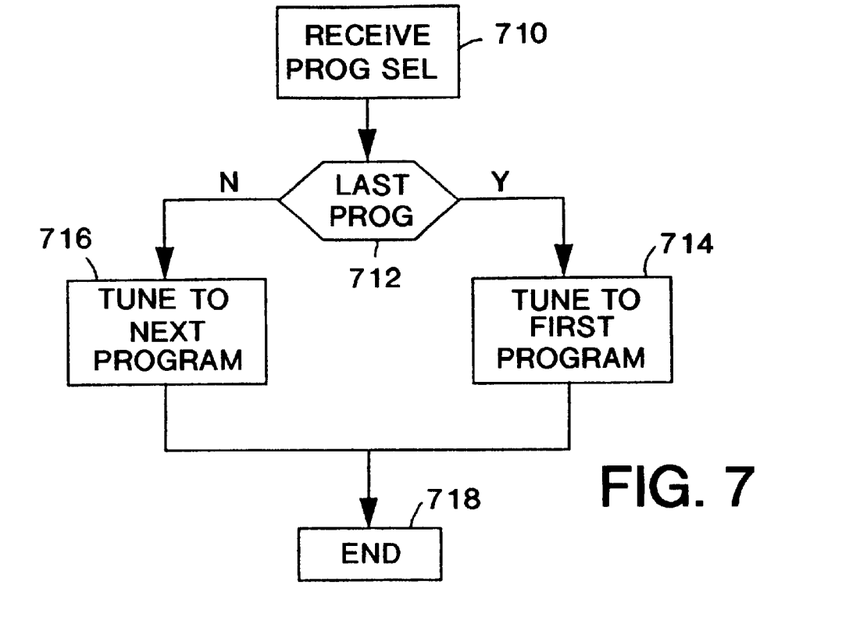

FIG. 7 describes a process executed by the microprocessor 114 which may be used as an alternative to selecting the program through numeric keypad 310. Using this process, the viewer may select a channel in the manner described above with reference to FIG. 6. When the channel is selected, the microprocessor 114 causes the tuner to tune to the selected channel, recovers the PAT and optionally the PMTs for the transport bit-stream to build the program correspondence table. Microprocessor 114 then instructs the digital audio/video processor 112 to decode the lowest-numbered program in the transport bit-stream. To view other programs in the transport bit-stream of the selected channel, the viewer presses the PROG SEL button 314. When the microprocessor 114 detects that this button has been pressed, it invokes the process shown in FIG. 7. The first step in this process, step 710, receives an indication that the PROG SEL button 314 has been pressed. At step 712, the process determines whether the program that is currently selected is the last program in the program correspondence table for the channel. If it is not, then, at step 716, the microprocessor instructs the digital audio/video processor 112 to decode and display using the PIDs for the next program in the program correspondence table. If, at step 712, the currently selected program is the last program in the program correspondence table then, at step 714, the microprocessor 114 instructs the processor 112 to decode and display using transport packets having PIDs related to the first program in the table. Thus, by repeatedly pressing the PROG SEL button, the viewer may cycle through all of the programs in a given transport bit-stream. If there is only one program in the bit-stream then pressing the PROG SEL button has no effect. After step 714 or step 716, step 718 is executed which returns control to the process that was running when the microprocessor 114 was interrupted.

Figure 8:
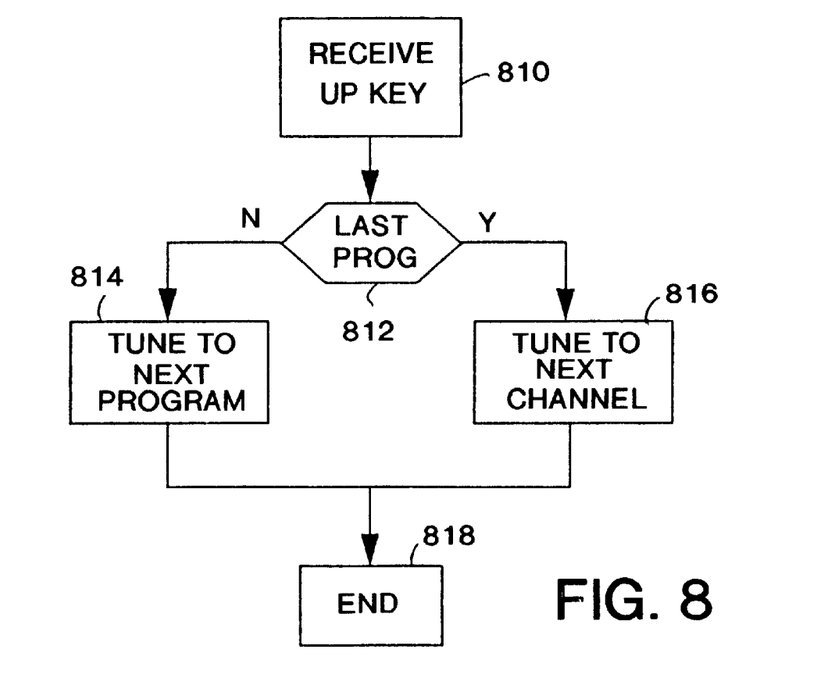

The final selection method to be described involves the use of the scroll up key 316 and scroll down key 318. Due to the similarity in the operation of these keys, only the process implemented for one of the keys, scroll-up key 316, is described. The process begins at step 810 when the process is invoked because the scroll up key 316 has been pressed. At step 812, the process determines whether the program currently being displayed is the last program in the program correspondence table for the current channel. If it is not, then, at step 814, the microprocessor 114 instructs the digital audio/video processor 112 to decode and display using data from packets having PIDs associated with the next program in the program correspondence table. If, however, at step 812, the process determines that the currently displayed program is the last program in the table, control is transferred to step 816 at which the microprocessor 114 instructs the tuner 110 to tune to the next channel in the scan list and, once that channel has been tuned, instructs the digital audio/video processor 112 to extract and decode packets for the first program in the program correspondence table. After step 814 or step 816, step 818 is executed which returns control to the process that was running when the microprocessor 114 was interrupted.

Thus, by scanning up, using the scan-up button 316, each program on each channel may be viewed in sequence. The scan down key implements a similar function except that the programs and channels are scanned in the opposite direction, from the current channel and current program to the next lower program in the program correspondence table and next lower channel in the receiver's scan list.

As set forth above, the processes described in FIGS. 6 through 8 may be made more efficient by having the digital audio/video processor 112 extract all of the programs in a transport bit-stream, storing each program in a distinct set of FIFO structures. This would enable the microprocessor 114 to switch between programs more quickly than if the program data were not already queued in the FIFO arrays.

As described above, all of these tuning methods may be used together. It may be advantageous to implement at least-the process described with reference to FIG. 8 along with the process described with reference to FIG. 6 or FIG. 7. The combined processes would allow a viewer to tune directly to a program if the program number and channel number were known or to tune to the channel and then scroll to the appropriate program.

While the invention has been described in terms of exemplary embodiments, it is contemplated that it may be practiced with modifications within the scope of the following claims.

What is claimed is:

1. A program selection apparatus for a digital television receiver comprising:

means for controlling the receiver to tune to a frequency corresponding to a channel signal containing a multi-program bit-stream;

means for recovering the multi-program bit-stream from the channel signal;

means for generating a program correspondence table from the recovered multi-program bit-stream, said program correspondence table directly identifying each program in the multi-program bit-stream with corresponding components of the program in the bit-stream; and program selection means, including means responsive to a first program in the program correspondence table, for selecting the components of the first program from the multi-program bit-stream to be decoded and displayed on the digital television receiver and means, responsive to the program correspondence table and to a program selection key, for selecting the components of a second program from the bit-stream using the program correspondence table, the second program being adjacent in the program correspondence table to the first program.

2. A program selection apparatus according to claim 1 wherein:

the means for controlling the receiver to tune to the frequency corresponding to the channel includes means for specifying a channel number; and the program selection means includes means for specifying the first and second program numbers to access information concerning the respective first and second programs in the program correspondence table.

3. A program selection apparatus according to claim 2 further comprising:

timing means which is reset when one of the first and second channel numbers is specified and which is active for a predetermined interval after it is reset; and means for receiving a numeric input value;

wherein the means for specifying the channel number receives the numeric input value when the timer is not active and the means for specifying the program number receives the numeric input value when the timer is active.

4. A program selection apparatus according to claim 1, wherein the digital television receiver includes a scan list containing a sequence of channels that may be tuned by the receiver, the program selection apparatus further comprising:

program scrolling means, responsive to the program correspondence table and to the scan list for selecting the components of a next program from the program correspondence table, when a previously selected program is not the last program in the program correspondence table and for selecting a next channel from the scan list when the previously selected program is the last program in the program correspondence table, the next channel being adjacent to a previously selected channel in the scan list.

5. A program selection apparatus according to claim 1, wherein:

the means for controlling the receiver to tune to the frequency corresponding to the channel includes means for specifying the channel.

6. A program selection apparatus according to claim 5, wherein the digital television receiver includes a scan list containing a sequence of channels that may be tuned by the receiver, the program selection apparatus further comprising:

program scrolling means, responsive to the program correspondence table and to the scan list for identifying the components of a next program from the program correspondence table, when the previously selected program is not the last program in the program correspondence table and for selecting a next channel from the scan list when the previously selected program is the last program in the program correspondence table, the next channel being adjacent to a previously selected channel in the scan list.

7. A method of selecting an individual program from a set of multi-program bit-streams which may be received by a digital television receiver comprising the steps of:

selecting a channel corresponding to one of the multi-program bit-streams;

receiving the one multi-program bit-stream corresponding to the selected channel;

generating, from the received multi-program bit-stream, a program correspondence table, the program correspondence table directly identifying each program in the received multi-program bit-stream with corresponding components of the program in the bit-stream; and responsive to the program correspondence table and to a program selection key, selecting a next program from the program correspondence table, the next program being adjacent, in the program correspondence table, to a previously selected program.

8. A method of selecting an individual program from a set of multi-program bit-streams which may be received by a digital television receiver having a scan list, the scan list containing a sequence of channels that may be tuned by the receiver, the method comprising the steps of:

selecting a channel corresponding to one of the multi-program bit-streams;

receiving the one multi-program bit-stream corresponding to the selected channel;

generating, from the received multi-program bit-stream, a program correspondence table, the program correspondence table directly identifying each program in the received multi-program bit-stream with corresponding components of the program in the bit-stream; and scrolling to a next program in the program correspondence table, when a higher numbered program exists in the program correspondence table and scrolling to a next channel from the scan list when a currently selected program is the highest numbered program in the program correspondence table, the next channel being adjacent to a previously selected channel in the scan list.

9. A method of selecting an individual program from a set of multi-program bit-streams which may be received by a digital television receiver comprising the steps of:

receiving a channel number to select a channel corresponding to one of the multi-program bit-streams;

receiving the one multi-program bit-stream corresponding to the selected channel;

generating, from the received multi-program bit-stream, a program correspondence table, the program correspondence table directly identifying each program in the received multi-program bit-stream with corresponding components of the program in the bit-stream;

receiving a program number and comparing the received program number to the program correspondence table to identify the corresponding program components from the program correspondence table; and responsive to the program correspondence table and to a program selection key, selecting a next program from the program correspondence table, the next program being adjacent, in the program correspondence table, to a previously selected program.

* * * * *